(12) United States Patent
Moulin

(10) Patent No.: US 6,222,666 B1
(45) Date of Patent: Apr. 24, 2001

(54) ELECTRO-OPTIC MODULATOR AND IMAGING DEVICE

(75) Inventor: Michel Moulin, Apples (CH)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/290,829

(22) Filed: Apr. 13, 1999

(30) Foreign Application Priority Data

Mar. 12, 1999 (EP) .................................................. 99104942

(51) Int. Cl.$^7$ ........................................................ G02B 1/03
(52) U.S. Cl. ............................................ 359/246; 359/245
(58) Field of Search .................................. 359/245, 246, 359/247, 239, 248

(56) References Cited

U.S. PATENT DOCUMENTS

| | | |
|---|---|---|
| 4,281,904 | 8/1981 | Sprague et al. . |
| 4,316,196 | 2/1982 | Jacobs .................................. 346/1.1 |
| 4,554,561 | 11/1985 | Daniele et al. . |
| 4,639,073 | 1/1987 | Yip et al. . |
| 4,746,942 | 5/1988 | Moulin . |
| 4,804,251 | 2/1989 | Jacobs . |
| 5,054,893 | 10/1991 | Schoon .................................. 359/254 |
| 5,111,320 | 5/1992 | Wysocki et al. ........................ 359/87 |
| 5,517,359 | 5/1996 | Gelbart . |

FOREIGN PATENT DOCUMENTS 60-026927    2/1985    (JP) .

Primary Examiner—Hung Xuan Dang
(74) Attorney, Agent, or Firm—Baker Botts L.L.P.

(57) ABSTRACT

An imaging device comprising an electro-optic modulator for modulating incident laser beams; an array of adjacent electrodes comprising a group of imaging electrodes addressed in accordance with image information; means to illuminate an area slightly larger than the width of said imaging electrodes; and one or more additional electrodes located on each side of said group of imaging electrodes to permanently direct extraneous marginal beams to light-stop means so that only the light emerging from the imaging electrodes is allowed to reach a light sensitive medium.

15 Claims, 4 Drawing Sheets

ELECTRO-OPTIC MODULATOR AND IMAGING DEVICE

BACKGROUND OF INVENTION

1. Field of the Invention

This invention generally relates to the exposure of light on a light-sensitive medium involving a spatial modulator to produce successive columns of individually controlled light spots and particularly relates to electro-optic modulators used in an imaging device for modulating incident light beams, which light is then allowed to reach the light-sensitive medium.

2. Description of the Prior Art

The electro-optic effect, in general, permits extremely rapid and direct modulation of a light phase front with an electronic drive signal.

Various types of electro-optic modulators have been proposed, such as described, for example, in U.S. Pat. Nos. 4,281,904, 4,316,196, 4,804,251, and 4,746,942.

According to U.S. Pat. No. 4,281,904, a TIR (total internal reflection) type of electro-optic device which has each electrode individually addressed is utilized. The operation of a TIR modulator depends on the effect of applying a voltage to a symmetrical electrode pattern to induce a change of the refractive index in an electro-optic element in the region of the surface of the element where the light is totally internally reflected. The electrode pattern is deposited on the surface of the element as an array with the electrodes being arranged parallel to the incident light beam. A voltage is applied to the electrode pattern and induces an electric field adjacent to the surface which alters the refractive index of the element. Thus, incident phase fronts are modulated by the TIR modulator to produce modulated light phase fronts. The electrodes within the electrode pattern are selectively activated in accordance with the desired image pattern.

TIR modulators are also used in U.S. Pat. No. 4,639,073 issued to Yip et al. and U.S. Pat. No. 4,554,561 issued to Daniele et al.

Another electro-optic modulator is the PLZT modulator, which is shown, e.g. in U.S. Pat. No. 4,746,942 to Moulin and U.S. Pat. No. 4,316,196 to Jacobs. The PLZT modulator has a plurality of interleaved electrodes, which, together with a crossed polarizer, forms an array of very small light gates. If a voltage is applied to the electrodes of the PLZT modulator, an electric field is created thus shifting the relative phases of light polarized parallel and perpendicular to the applied field. The plane of polarization of light transmitted to the zones between the electrodes is rotated upon the application of proper voltages to the electrodes.

Hence, electro-optic modulators are used to produce successive columns of individually controlled light spots. Images are produced on the light-sensitive medium by a succession of adjoining bands of spots to produce text and graphics on a film, a printing plate or other medium on which images are to be produced.

In order to avoid any noticeable discontinuity between adjacent bands, it is not only necessary that the relative displacement of the bands and the light-sensitive medium exactly correspond to the size of a column of spots, but also that all the spots be substantially identical in form and intensity. In addition, it is preferred that only the light emerging from the independently selected spot-producing elements of the electro-optic modulator reach the light-sensitive medium at the imaging plane.

To achieve desired uniformity between selected spots, all the selectable elements or gates of the modulator must be uniformly illuminated. This can better be achieved by illuminating an area larger than the zone occupied by the selectable modulator elements in order to compensate for the decrease in intensity of the incident light at the edges of the light phase front. It is then desirable to prevent the extraneous radiation overlapping said zone because of misalignment or for other reasons from reaching the light-sensitive medium.

In general, multi-electrodes modulating systems associated with a light sensitive medium for imaging do not allow light (or other radiation) to reach the medium in the absence of energizing selected electrodes. In these systems, the light intensity of the spots reaching the medium is obtained by rays that have incurred a loss of energy caused by the modulating system as they pass through the modulator material. They can generally produce good image contrast, but at the expense of efficiency. Such systems may include deformable mirrors, crossed polarizers, deflection by diffraction. For imaging supports requiring higher radiant energy such as heat-sensitive polymer printing plates, it is desirable to lose as little energy as possible through the modulator, even at the expense of a loss of contrast. This can be achieved by letting light beams, unimpeded by the modulator, reach the sensitive medium. In this approach, the modulator electrodes are normally inactivated to allow all the energy from the incident light beams to reach the medium. Any activated electrode will block the beam it controls. In other words, all the electrodes are activated when no light should reach the medium. In this alternative, the illuminated area reaching the modulator should be exactly confined to the imaging electrode area of the modulator to avoid the influence of leakage of marginal rays that would expose the light-sensitive medium. The uniformity in illumination or exposure of the light-sensitive medium would be negatively affected by these marginal rays reaching the active zone of the medium at its edges.

The insertion of a mask to limit the illumination to the active zone, although simple in appearance, presents difficulties of implementation and the marginal rays adjacent to the ends of the imaging zone are affected by diffraction by the mask edges.

SUMMARY OF THE INVENTION

One object of the invention is to provide an imaging device and method for eliminating edge effects in spatial modulators.

Another object of the invention is to provide an electro-optic modulator which is highly efficient, results in uniform images on the light-sensitive medium and yet is relatively inexpensive.

It is another object of the invention to provide an improved electro-optic modulator and method for modulating light.

It is also an object of the invention to improve the performance and utility of electro-optical modulators.

The present invention seeks to overcome the foregoing drawbacks by providing an electro-optic modulator comprising electronic masking means to prevent stray light rays from reaching the light sensitive media. The provision of the masking means at or inside the modulator minimizes the distance of the masking means to the plane of modulation. Having the masking means in the same or close to the same plane as the electrodes eliminates any diffraction effect that may be caused by having mechanical masking means upstream from the modulator.

In an embodiment according to the present invention, said masking means is a permanent mask introduced into the modulator. This permanent mask can be a sheet or film or the like for masking extraneous light rays.

According to a preferred embodiment, the masking means comprises one or more additional electrodes located on one or both sides of the imaging electrodes of the modulator. The additional electrodes permanently direct extraneous marginal beams to light-stop means so that only the light emerging from the imaging electrodes is allowed to reach the light-sensitive medium. This arrangement has the further advantage that the masking means in the form of the additional electrodes is in the same plane as the imaging electrodes. Therefore, any diffraction effects are avoided. The manufacturing of this arrangement is easy and inexpensive since the imaging electrodes and the additional electrodes can be manufactured in one step in one layer of the modulator.

It is also preferred that the modulator be an electro-optic modulator such as a TIR modulator or a PLZT modulator.

From another aspect thereof, the subject invention resides in an imaging device comprising an electro-optical modulator for modulating incident light beams; said device comprising an array of adjacent electrodes comprising a group of imaging electrodes addressed in accordance with image information; means to illuminate an area slightly larger than the width of said imaging electrodes; and one or more additional electrodes located on the modulator on one or both sides of said group of imaging electrodes to permanently direct extraneous marginal beams to light-stop means so that only the light emerging from the imaging electrodes group is allowed to reach the light-sensitive medium.

In another aspect of the present invention, the imaging method of recording information on a light-sensitive medium comprises the steps of forming a light beam, projecting the light beam into a modulator comprising a group of imaging electrodes and masking means, wherein the light beam is projected into the modulator such that the illuminated area is larger than the area occupied by the imaging electrodes, selectively energizing the imaging electrodes in accordance with the desired image, and directing the modulated light beams emerging from the modulator to the light sensitive medium.

In the present specification, "light" is typically, but without limitation UV, visible or IR radiation. Other objects, features and advantages of the invention will be apparent to those skilled in the art upon review of the following detailed description and drawings which show by way of illustration, and not limitation, preferred embodiments of the invention.

BRIEF DESCRIPTION OF THE DRAWINGS

The invention will be further explained with reference to the drawings. In the drawings, same reference numbers represent identical or similar components.

These figures, which are idealized, are not to scale and are intended to be merely illustrative and non-limiting.

DESCRIPTION OF THE PREFERRED EMBODIMENTS

In the following, the term "height" describes the length of a column of dots produced by the assembly of imaging electrodes and the term "width" describes the thickness of a slice of dots generally of the order of 1 micron on the medium.

Figure 1:
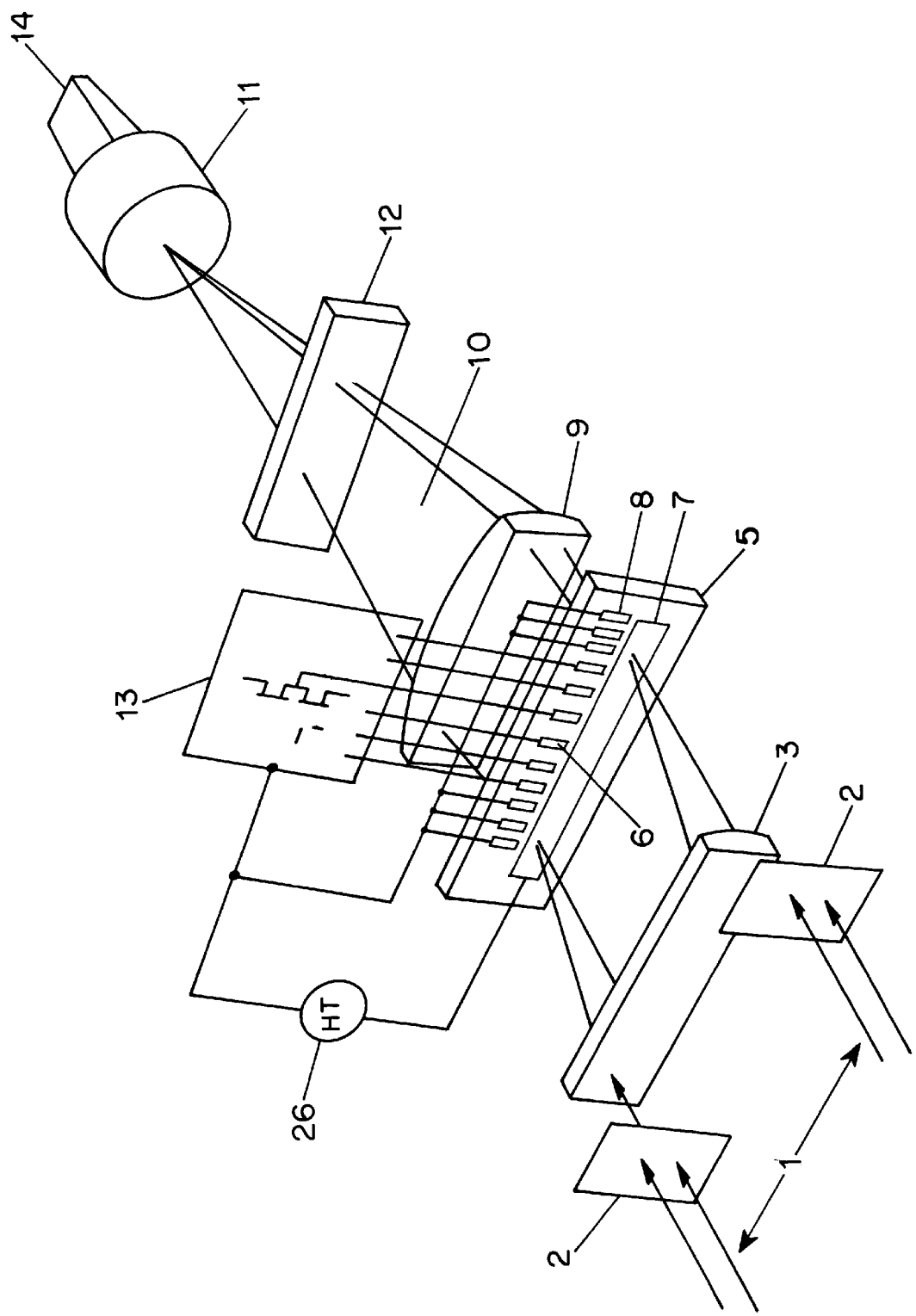
FIG. 1 illustrates a schematic representation of an assembly according to the present invention comprising a PLZT modulator.
Figure 2:
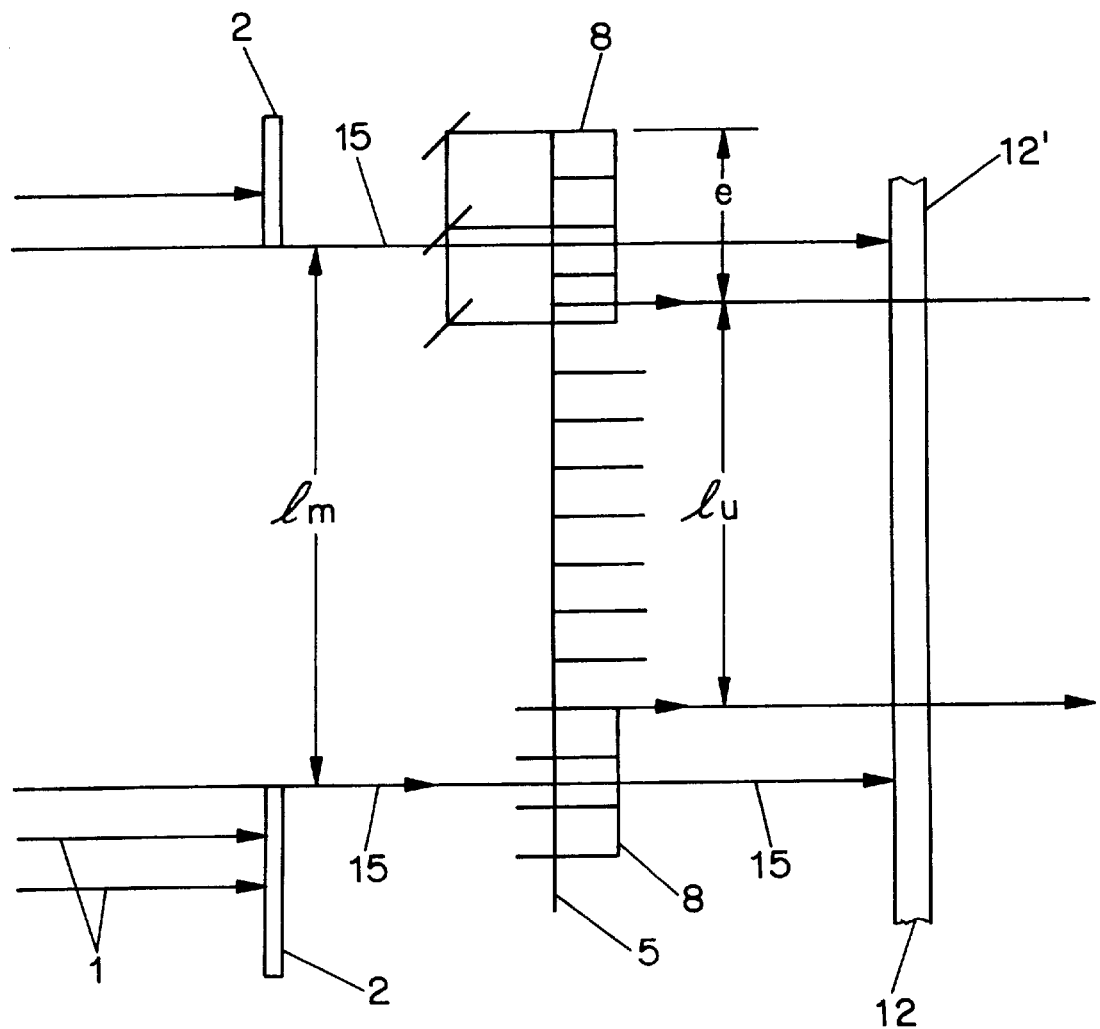
FIG. 2 illustrates the implementation of the present invention.

FIGS. 1 and 2 of the drawings shows a schematic representation of an assembly according to a first preferred embodiment of the present invention. According to this embodiment, a PLZT modulator is utilized. The collimated rays 1 of light incident on the modulator 5 are first blocked at both sides of the illumination zone by means of a mask 2. The remaining collimated rays pass the lens 3 and are thus directed to the surface of the modulator 5. Other suitable means to direct the remaining light to the surface of the modulator, such as mirrors or the like will be apparent to those skilled in the art. The modulator 5 blocks selected ones of the light rays, as it will be explained in greater detail below. The beams of light 10 emerging from the modulator pass a lens 9 or other similar means as necessary and a polarizer 12 and finally reach an objective 11. On the other side of the objective, the image 14 can be obtained.

The modulator 5 comprises a first group 6 of adjacent electrodes which are the imaging electrodes. On each side of the modulating imaging group of electrodes 6, additional electrodes 8 are located causing extraneous light rays 15 to be blocked downstream. The electrodes 6 and 8 are preferably arranged parallel to each other and, adjacent to these electrodes, a common electrode 7 is provided. The additional electrodes 8 are connected to a voltage source 26 in order to energize the electrodes with a voltage high enough to block the extraneous light rays 15. The group of imaging electrodes 6 is supplied with control voltages via a driver circuit 13. Thus, each of the imaging electrodes can be controlled or selected independently from the other imaging electrodes, thus allowing control of the modulator in accordance with the desired image.

FIG. 2 schematically shows how the extraneous light rays 15 are blocked. The thin sheet-like bundle of rays 1 produced by a laser and associated optics is first limited by a mask 2 to a width $l_m$ but still covers more than the total width of the imaging electrodes. Thus, not only the useful imaging zone defined by the imaging electrodes 6 is illuminated but also a certain area on both sides of the imaging electrodes where the additional electrodes are provided. It illuminates an area extending beyond the width $l_u$ of imaging electrodes group 6 by overlapping rays covering section e on each side of the imaging electrodes. The thickness of the bundle of rays falls within the thickness of the modulator elements but its width extends beyond the width of their assembly represented by $l_u+2e$. On each side of the modulating imaging group of electrodes 6 are located additional electrodes 8 to cause extra marginal light rays 15 to be blocked downstream. Due to this structure, an area larger than the zone occupied by the imaging electrodes is illuminated resulting in a uniform illumination of the imaging electrodes of the modulator. The portion of the light phase front reaching the light-sensitive medium has a substantially uniform intensity whereas the edges of the light phase front illuminate the additional electrodes. This resulting extraneous radiation is however prevented from reaching the light-sensitive medium by the provision of the additional electrodes.

Figure 5:
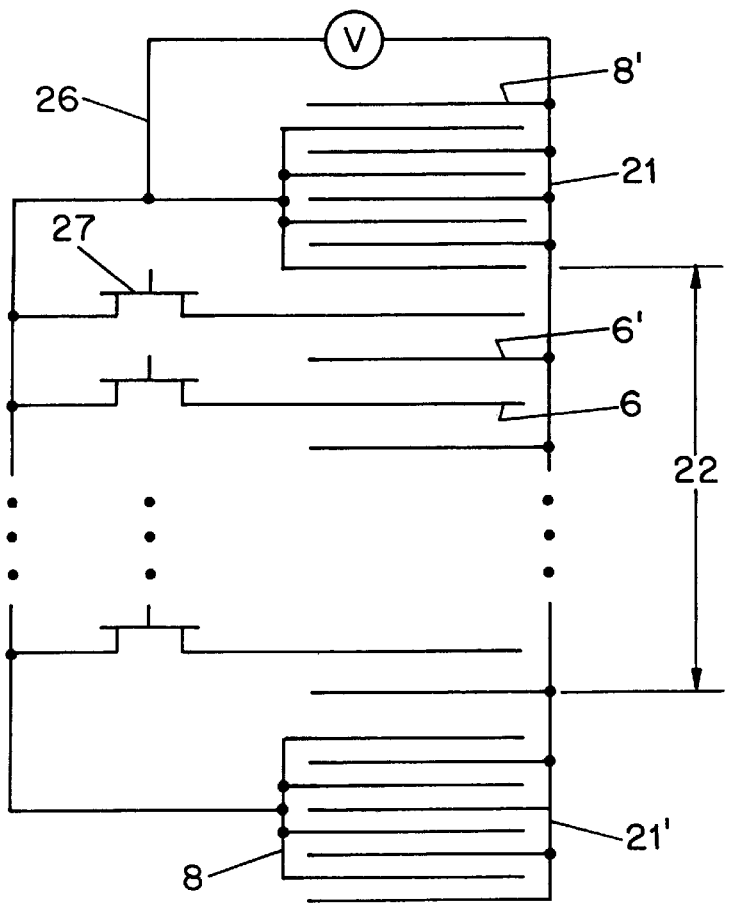
FIG. 5 illustrates a partial circuit schematic showing the electrodes.

In the case where a PLZT modulator is used, the added electrodes 8 are connected to a common voltage control 26 (FIG. 5). The field induced by this voltage interact with the inputted radiation to block its passage beyond the useful imaging zone. This is represented in FIG. 2 where it is shown that the rays 15, emerging from the electrodes 8 are blocked by polarizer 12 at location 12' independently of the operation of imaging electrodes 6.

Figure 3:
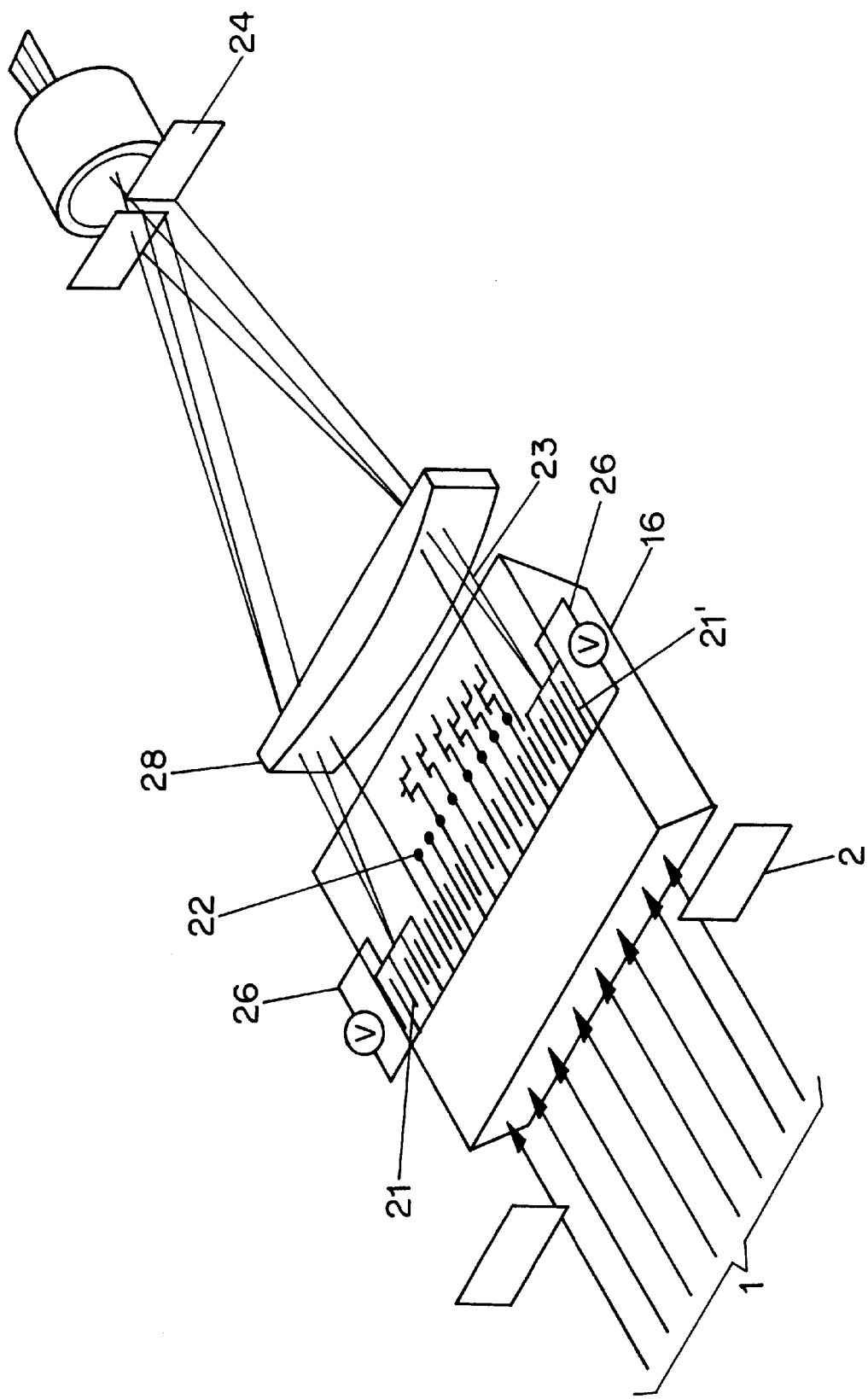
FIG. 3 illustrates an alternative embodiment of the present invention using a TIR modulator.

FIG. 3 illustrates a second embodiment of the present invention utilizing a TIR modulator. These modulators are well-known in the art, they operate to selectively deflect or bend high intensity beams from the laser. They depend on the effect of applying a voltage to an electrode pattern to induce change of the refractive index in an electro-optic element in the region of the surface of the element where the light is totally internally reflected. The emerging beams are diffracted into a series of orders. In general in images based on this system, rays of zero or low orders are prevented from reaching the light sensitive medium in the recording plane by a stop. The higher orders are focussed to form an image of the selected spots. In the preferred embodiment of the invention, only the zero order beams are allowed to reach the recording plane with a minimal loss of energy. To obtain blank areas at the imaging plane, the electrodes corresponding to these areas are activated, thus causing practically all the light energy emerging from the modulator to be concentrated in the higher order of the diffracted beams which are prevented from reaching the recording plane by a mask.

Referring to FIG. 3, the collimated light beams emerging from a laser and associated optics to form a sheet-like bundle are shown at 1. Their width limited by baffles 2, is large enough to fill the full width of the modulator 16. The electrodes of the modulator are divided into a first group of imaging electrodes individually subjected to voltage variations for the projection of individually selected light spots located in zone 22 (FIG. 5), and a second group of electrodes located in zones 21 and 21' on each side of the first group, permanently energized through common circuit 26 in order to prevent extraneous "noise" rays extending beyond the imaging electrodes to reach the imaging plane. These rays shown at 23, after emerging from field lens 28, are blocked by mask 24 located at the focus of the field lens. This results in a uniform illumination of the imaging electrodes without allowing extraneous light rays to reach the light-sensitive medium.

Figure 4:
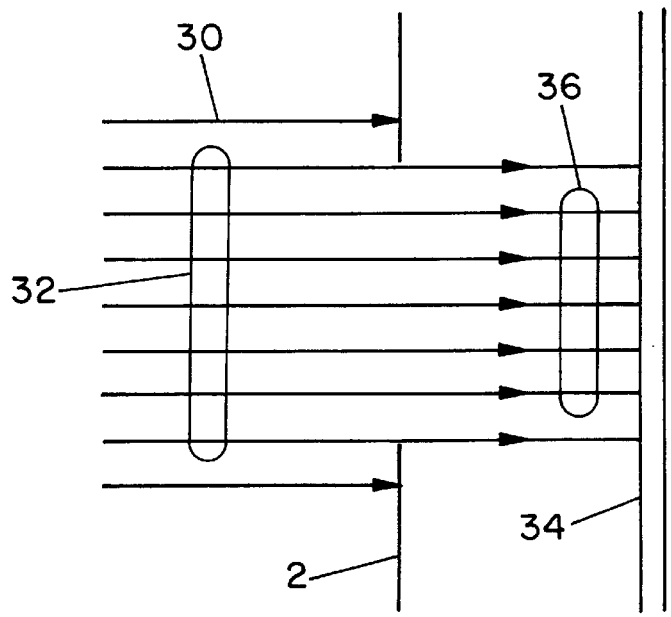
FIG. 4 illustrates the blocking of extraneous light rays according to the present invention.

FIG. 4 illustrates in more detail how the extraneous light rays are blocked according to the present invention. A bundle of rays 32 is obtained by blocking the sheet-like bundle of light rays 30 by means of mechanical blocking means, such as a mask 2. The additional electrodes provided at the modulator 34 further reduce the illumination zone, so that only the light rays indicated by reference numeral 36 reach the imaging electrodes.

According to the invention, the imaging and/or masking electrodes may be shaped and located as shown in FIG. 5. Other acceptable configurations will be apparent to those skilled in the art. One arrangement of the electrodes are shown, e.g. in U.S. Pat. No. 4,746,942, incorporated herein by reference. The electrodes are joined into two conducting blocks each comprising a plurality of electrode fingers or arms (6,6', 8,8'). The arms (6,8')of one block of electrodes are interleaved between adjacent arms (6',8') of the other block. The arms of the conducting blocks are divided into the imaging group 22 thus comprising two sets of adjacent electrodes, and the two sets of masking electrodes 21, 21' provided on both sides of the imaging group. The electrode arms 8 of the masking group are directly connected to a common voltage control 26, whereas control means, such as switches 27, are provided at the electrodes of the first set of electrodes of the imaging group. Thus, each electrode of the first set can be separately supplied with the control voltage.

It is to be understood that the exemplary embodiments in no way limit the scope of the invention. Other modifications of the invention will be apparent to those skilled in the art in view of the foregoing descriptions. Accordingly, the invention is not limited to the described embodiments and all alternative modifications and variations of the present invention which fall within the spirit and scope of the appended claims are covered.

I claim:

1. An electro-optic modulator comprising: (a) an assembly of imaging electrodes, said assembly comprising a first electrode group of adjacent electrodes connected to a first driving means so that each of the electrodes can separately be supplied with a driving voltage and a second electrode group comprising at least one electrode connected to a second driving means for supplying voltage to the second electrode group; and (b) a mask for blocking extraneous light rays wherein the mask is adjacent to the assembly of imaging electrodes.

2. The modulator as defined in claim 1, wherein said mask is provided at one or both sides of the group of imaging electrodes.

3. The modulator as defined in claim 1 or 2, wherein the mask is provided with third and fourth groups of electrodes, each of the electrodes of the third group being connected to a common voltage level and each of the electrodes of the fourth group being connected to the same or another common voltage level, said third group of electrodes being located at one side of the imaging electrodes and said fourth group of electrodes being located on the other side of said imaging electrodes.

4. The modulator as defined in claim 1, wherein said mask is a permanent mask introduced into the modulator.

5. The modulator according to claim 4, wherein said permanent mask is in or close to the plane of the imaging electrodes.

6. The modulator as defined in claim 1, wherein said modulator is a PLZT modulator.

7. The modulator as defined in claim 1, wherein said modulator is a total internal reflection (TIR) type modulator.

8. An imaging device for forming images, said device comprising:

(I) a laser source emitting light;
(II) a modulator modulating said light emitted from said laser source, the modulator comprising:
(a) an assembly of imaging electrodes, said assembly comprising a first electrode group of adjacent electrodes connected to a first driving means so that each of the electrodes can separately be supplied with a driving voltage and a second electrode group comprising at least one electrode connected to a second driving means for supplying voltage to the second electrode group; and
(b) a mask for blocking extraneous light rays wherein the mask is adjacent to the assembly of imaging electrodes;
(III) means for directing said light from said laser source to said modulator; and
(IV) means for directing said modulated light from said modulator to a light sensitive medium.

9. An imaging method for recording information on a light sensitive medium, said method comprising the steps of: (a) forming a light beam, (b) projecting the light beam into a modulator comprising (i) an assembly of imaging electrodes comprising a first electrode group of adjacent electrodes connected to a first driving means so that each of the electrodes can separately be supplied with a driving voltage and a second electrode group comprising at least one electrode connected to a second driving means for supplying voltage to the second electrode group, and (ii) a mask for blocking extraneous light rays wherein the mask is adjacent to the assembly of imaging electrodes, and the light beam is projected into the modulator such that the illuminated area is larger than the area occupied by the imaging electrodes, (c) selectively energizing the imaging electrodes in accordance with the desired image, and (d) directing the modulated light beams emerging from the modulator to the light sensitive medium.

10. A method as defined in claim 9, in which the masking means comprises electrodes adjacent to the imaging electrodes, wherein the masking electrodes are continuously energized in order to block extraneous light.

11. A method as disclosed in claim 9, in which the masking means comprises a permanent mask introduced into the modulator.

12. An electro-optic modulator comprising:
    (a) an assembly of imaging electrodes, said assembly comprising a first electrode group of adjacent electrodes connected to a first driving means so that each of the electrodes can separately be supplied with a driving voltage and a second electrode group comprising at least one electrode connected to a second driving means for supplying voltage to the second electrode group; and
    (b) a mask for blocking extraneous light rays wherein the mask is provided at one or both sides of the assembly of imaging electrodes.

13. An electro-optic modulator comprising:
    an electro-optic substrate; and
    an electrode array mounted on said substrate, said electrode array comprising an assembly of imaging electrodes, said assembly comprising a first electrode group of adjacent electrodes connected to a first driving means so that each of the electrodes can separately be supplied with a driving voltage and a second electrode group comprising at least one electrode connected to a second driving means for supplying voltage to the second electrode group, said array having electrode portions extending beyond the imaging area of said modulator, wherein said electrode portions extending beyond the imaging area mask extraneous light rays.

14. A method for modulating a light beam produced by a light source, the method comprising the steps of:
    mounting an electrode array on an electro-optic substrate, said array comprising an assembly of imaging electrodes, said assembly comprising a first electrode group of adjacent electrodes connected to a first driving means so that each of the electrodes can separately be supplied with a driving voltage and a second electrode group comprising at least one electrode connected to a second driving means for supplying voltage to the second electrode group; and
    extending portions of said electrode array beyond the modulating region of said modulator, wherein said extended portions of said electrode array mask extraneous light rays and diffract edge light located outside said modulating region.

15. The method of claim 14, in which the mask comprises mechanical masking upstream of electronic masking.

* * * * *